United States Patent
Hennig et al.

(10) Patent No.: US 7,148,687 B2
(45) Date of Patent: Dec. 12, 2006

(54) METHOD FOR THE ACQUISITION OF MOVING OBJECTS THROUGH NUCLEAR MAGNETIC RESONANCE TOMOGRAPHY

(75) Inventors: Jürgen Hennig, Freiburg (DE); Oliver Speck, Freiburg (DE)

(73) Assignee: Universitatsklinikum Freiburg, Freiburg (DE)

( * ) Notice: Subject to any disclaimer, the term of this patent is extended or adjusted under 35 U.S.C. 154(b) by 0 days.

(21) Appl. No.: 11/289,748

(22) Filed: Nov. 29, 2005

(65) Prior Publication Data

US 2006/0076953 A1 Apr. 13, 2006

(51) Int. Cl.
*G01V 3/00* (2006.01)

(52) U.S. Cl. ....................... 324/309; 324/307

(58) Field of Classification Search ......... 324/309, 324/307, 318, 319, 322
See application file for complete search history.

(56) References Cited

U.S. PATENT DOCUMENTS

| | | | | |
|---|---|---|---|---|
| 5,378,986 | A * | 1/1995 | Seo et al. ............... | 324/309 |
| 5,423,315 | A * | 6/1995 | Margosian et al. ......... | 600/410 |
| 5,636,636 | A | 6/1997 | Kuhn et al. | |
| 6,054,853 | A * | 4/2000 | Miyamoto et al. ........ | 324/309 |
| 6,288,543 | B1 * | 9/2001 | Listerud et al. ........... | 324/309 |
| 6,814,280 | B1 * | 11/2004 | Miyoshi et al. ............ | 324/319 |
| 2002/0115929 | A1 * | 8/2002 | Machida ................ | 600/410 |
| 2002/0140423 | A1 | 10/2002 | Brittain | |

FOREIGN PATENT DOCUMENTS

| | | |
|---|---|---|
| EP | 0 642 031 A1 | 3/1995 |
| EP | 0 654 675 A1 | 5/1995 |

OTHER PUBLICATIONS

Y, Zhu, Ch.L. Dumoulin: "Extended Field-of-View Imaging With Table Translation and Frequency Sweeping." Magnetic Resonance in Medicine, vol. 49, No. 6, May 16, 2003, pp. 1106-1112, XP001163044, ISSN: 0740-3194 *pp. 1106-1109: "Introduction", "Materials and Methods"*.

* cited by examiner

*Primary Examiner*—Brij B. Shrivastav
(74) *Attorney, Agent, or Firm*—Walter A. Hackler

(57) ABSTRACT

A nuclear magnetic resonance (NMR) tomography method for investigating a target object, wherein radio frequency (RF) pulses are irradiated into a target volume and/or RF pulses from the target volume are detected, wherein the target volume is determined by the frequency of the RF pulses and/or through magnetic field gradients, and wherein the target object is moved relative to the NMR tomograph during NMR data acquisition, is characterized in that the frequency of the RF pulses and/or the magnetic field gradients is/are changed during NMR data acquisition such that the target volume covered by the RF pulses is moved relative to the NMR tomograph at the same speed and direction of motion as the target object during NMR data acquisition. This provides a method for investigating a target object which moves relative to the NMR tomograph during NMR data acquisition, which can be carried out in a fast and simple manner.

12 Claims, 7 Drawing Sheets

METHOD FOR THE ACQUISITION OF MOVING OBJECTS THROUGH NUCLEAR MAGNETIC RESONANCE TOMOGRAPHY

BACKGROUND OF THE INVENTION

The invention relates to a method of nuclear magnetic resonance (NMR) tomography for investigating a target object, wherein radio frequency (RF) pulses are irradiated into a target volume and/or RF pulses from the target volume are detected, wherein the target volume is determined by the frequency of the RF pulses and/or through magnetic field gradients, and wherein the target object is moved relative to the NMR tomograph during NMR data acquisition.

NMR tomography methods with moving target objects are known from Kruger et al., Magnet. Reson. Med. 47 (2002), 224, and also from Scheffler, Proc. 9$^{th}$ Meeting ISMRM, Glasgow (2001), 1774.

NMR tomography is mainly used for medical diagnostics to obtain information about the volume (i.e. the inside) of a target object, in particular about diseased or possibly diseased regions of a human body thereby utilizing the interaction between nuclei and electromagnetic pulses.

NMR images are typically acquired in individual flat slices. To investigate larger target objects, individual recordings of several slices of the target object can be produced. When one slice is completely recorded, the target object is displaced slightly perpendicularly to the slice plane relative to the NMR tomograph and a further slice is subsequently recorded. In these simple cases, the target object is immobile during the actual NMR data acquisition.

Recording methods of objects which are moved during the NMR data acquisition (mainly for use for so-called total body imaging) are known from literature (see e.g. Kruger et al, Magnet. Reson. Med. 47 (2002), 224) which use different principles. Methods were developed wherein the motion occurs within the recording plane (i.e. the slice). With stationary magnetic field gradients, such motions produce primarily displacement of the recording data relative to the recorded target object. When recording methods are used which are based on repeated recording of in each case differently locally encoded signals, this displacement differs in correspondence with the continuous motion of the object from one recording step to the next. This displacement can be compensated for through corresponding data post-processing when the displacement speed is known.

Methods for recording images during motion perpendicular to the recording plane are also known (see e.g Scheffler, Proc. 9$^{th}$ Meeting ISMRM, Glasgow, (2001), page 1774). In the conventional methods, the displacement speed is thereby selected such that the inconsistency of the data due to the displacement remains small thereby hardly influencing the recording quality. In general, these methods are carried out such that the motion advance over an image acquisition is small compared to the thickness of the selected volume (i.e. the volume to be investigated). Fast acquisition techniques such as e.g. trueFISP or gradient echo sequences are used for such recording methods, which are largely stable compared to image artefacts caused by motion. These methods still have the disadvantage that the small motion advance prolongs the overall duration of the NMR investigation.

In contrast thereto, it is the underlying purpose of the present invention to present a method for investigating a target object, which moves relative to the NMR tomograph during NMR data acquisition, which can be carried out in a fast and simple fashion.

SUMMARY OF THE INVENTION

This object is achieved by a method of the above-mentioned type in that the frequency of the RF pulses and/or the magnetic field gradients is/are changed during the NMR data acquisition such that during NMR data acquisition, the target volume covered by the RF pulses is moved relative to the NMR tomograph at the same speed and in the same direction of motion as the target object.

The target object is moved inside of the NMR tomograph. A small part inside of the NMR tomograph is thereby selected as target volume for data acquisition through the magnetic field gradients, in particular slice selection gradients and the frequency of the RF pulse. In accordance with the invention, the frequency of the RF pulses and/or the strength of the magnetic field gradients is/are changed during NMR data acquisition such that the position of this target volume is carried along with the moved target object thereby always obtaining the NMR data from the same local region of the target object.

One variant of the inventive method is particularly advantageous, wherein a slice-shaped target volume is investigated during NMR data acquisition. Known slice selection gradients can thereby be used to select the target volume. Carrying along of the target volume together with the target object is moreover facilitated when the target object moves perpendicularly to the slice normal (i.e. the recording plane). The plane could also be tilted as long as the motion has at least one component, other than zero, perpendicular to the recording plane.

In a particularly preferred design of this method variant, the target object moves parallel to the surface normal of the slice-shaped target volume. Target objects with long extension in one dimension can be guided through the inside of the NMR tomograph (or also the NMR tomograph can be guided over the target object). The target object (e.g. a person) can basically be investigated along its full length, typically with several NMR data acquisitions from different slices and continuous motion of the target object relative to the NMR tomograph during and between all NMR data acquisitions.

In a preferred variant of the inventive method, the magnetic field gradients are kept constant during the NMR data acquisition and only the frequency of the RF pulses is changed. Permanent change of the magnetic field gradient with great precision is difficult, in particular since the shieldings must be adjusted to the varying gradient. In contrast thereto, exact adjustment of the frequency of the RF pulses is relatively simple and high recording quality of the NMR data acquisition can be obtained.

One particularly preferred design of the method variant is characterized in that the following applies for the Larmor frequency ω of the RF pulses:

$$\omega(t)=\gamma^* B_0+\gamma^* GS^* v^* t$$

wherein γ is the gyromagnetic ratio, $B_0$ is the static magnetic field, GS is the magnetic field gradient, v is the speed of the target object and t is the time. The target object thereby moves at a constant speed relative to the NMR tomograph perpendicularly to the recording plane. This frequency setting ensures carrying along of the target volume with the target object in a simple manner. Adjustment of linear temporal changes of the Larmor frequency of the radio frequency (RF) pulses is easy.

In an advantageous method variant, the target object is uniformly moved relative to the NMR tomograph thereby greatly facilitating adjustment of the frequency of the RF pulses and/or the magnetic field gradients. Uniform motion of the target object can be easily set also in a fashion protecting the possibly human target object. A uniform motion means a steady, straight motion.

One method variant is also preferred, which is characterized in that the motion of the magnetic field gradients is compensated for in the direction of motion of the target object relative to the speed of the target object, in particular in that the motion of the magnetic field gradients is bipolarly compensated for such that speed-dependent dephasing of the RF pulses is eliminated.

In a further preferred method variant, a multi-echo sequence is used in accordance with the RARE method principle, wherein the pulse phase is additionally adjusted in correspondence with the CPMG conditions of the motion of the target object. The RARE method utilizes several excitation pulses which precludes use of this method for moving target objects without carrying along the target volume as in accordance with the invention.

One method variant is also preferred, wherein a multi-slice technology is used for investigating ns slices. The multi-slice technology permits considerable reduction of the measuring time for larger target objects.

One method of NMR tomography for investigating a target object is also within the scope of the present invention, which is characterized in that several NMR data acquisitions are cyclically repeated by the above-mentioned inventive method. This permits continuous investigation of target objects of any length in the direction of motion. Each NMR data acquisition permits investigation of another region of the target object which is disposed in the measuring period in the inside of the NMR tomograph in each case.

The present invention also includes a method of NMR tomography for investigating a target volume which is characterized in that several NMR data acquisitions are carried out successively by the above-mentioned inventive methods, and wherein after each NMR data acquisition, the position of the target volume relative to the NMR tomograph is reset to an initial position. The NMR tomograph has an admissible displacement region for the region of the target object to be measured in which the NMR data is recorded. After termination of the NMR data acquisition of this region (typically this slice) the target volume returns to investigate a new region of the target object. The target object can then be effectively scanned region by region.

One variant of these two last-mentioned methods is particularly preferred, wherein a slice-shaped target volume is investigated during NMR data acquisition, and the target object moves further by exactly one slice thickness during one NMR data acquisition. In this case, the successively investigated regions of the target object border directly, such that the target object can be completely investigated (i.e. imaged) during the entire NMR method.

One method variant is furthermore preferred, which is characterized in that the position of the target volume is changed by a distance ds during NMR data acquisition with m individual steps required for complete slice reconstruction after k=np*m/ns individual steps, which distance ds corresponds to the spatial separation of the position of neighboring slices, such that after acquisition of N*m individual steps for a total of N*ns−(ns/np−1)−slices, complete data is obtained for image reconstruction, wherein np≧1 (and preferably np=1), N≧1. This saves time by a factor of ns compared to the above-mentioned acquisition with the individual slice method for investigating large target objects.

One variant of the inventive method is particularly preferred, wherein during NMR data acquisition, two or more measuring sequences are applied in a nested manner, wherein the measuring sequences generally produce signals with different contrast, and wherein each measuring sequence acts on a different partial volume of the target object. Thus two or more image contrasts can be acquired with one single passage of the target object through the NMR tomograph.

Further advantages of the invention can be extracted from the description and the drawing. The features mentioned above and below may be used in accordance with the invention either individually or collectively in arbitrary combination. The embodiments shown and described are not to be understood as exhaustive enumeration but have exemplary character for describing the invention.

The invention is shown in the drawing and is explained in more detail with reference to embodiments.

FIG. 1 shows a schematic illustration of the signal loss through migration of the excited region of a moving target object in accordance with prior art;

FIG. 2 shows a schematic illustration of the signal loss through migration of a structure S of a moving target object in accordance with prior art;

FIG. 3 shows a schematic illustration of the phase position of a spin in a moving target object in accordance with prior art;

FIG. 4 shows a schematic illustration of the inventive method with individual steps A1 through Am;

FIG. 5 shows a schematic illustration of the inventive principle of a continuous recording of a uniformly moving target object;

FIG. 6 shows a schematic illustration of the inventive principle of a continuous recording using a multi-slice method with ns individual steps;

FIG. 7 shows a schematic illustration of an inventive NMR data acquisition with 2 pulse sequences for different image contrasts.

DESCRIPTION OF THE PREFERRED EMBODIMENT

The invention relates to NMR acquisition techniques, wherein displacement occurs not in the plane of the recorded image (in particular slice) but wherein the target object is displaced perpendicularly to the image plane during recording.

For considering the effect of such a displacement, it must be noted that data acquisition of a magnetic resonance (MR) image is performed sequentially and in many acquisition methods through repeated recording of individual steps, which differ through change of the respective phase encoding of the individual steps in case of the generally used Fourier transformation method.

The motion of the target object during the recording may concern the signal intensity of each individual step, as well as the consistency of the total number of individual steps used for image reconstruction.

In the first case, signal loss occurs always when more than one single, slice-selective radio frequency pulse is used to generate a signal. This is the case e.g. for spin echo methods, wherein an excitation pulse followed by at least one excitation pulse, in the case of the RARE (also called TSE, FSE) method also several excitation pulses, is/are used to generate a signal. If the object moves during application of such a sequence, a signal loss occurs already during recording of each individual step, because part of the volume to be investigated moves out of the volume detected by the measuring sequence thereby preventing measurement of the spins contained therein (FIG. 1).

A further effect is obtained if a structure to be represented remains to a large extent in the investigated slice during recording of an individual step, but moves out of the volume under investigation during recording of the total number of the individual steps (i.e. the total duration of an NMR data acquisition of one slice). Acquisition of the data required for image reconstruction is incomplete for spins from such a structure S within the moving target object, which produces image artefacts, in particular unsharpness (FIG. 2).

In addition to these partial volume effects, further signal losses or image artefacts occur in that the rephasing conditions for the gradients used during acquisition for local encoding are no longer met due to the motion of the spins (FIG. 3). The spins experience dephasing during slice selection through a radio frequency pulse in the presence of a slice selection gradient due to their Larmor precession in the respectively local magnetic field which results from superposition of the position-independent basic field B0 with a position-dependent portion produced by the slice selection gradient. Spins at different positions in the direction of the gradient thereby experience different dephasing which must be cancelled by corresponding compensating gradient steps before signal readout. If the object does not move, this dephasing can be compensated for in the simplest case through a following gradient of negative amplitude and identical surface. If the object moves during the acquisition, this motion produces a continuous change of the magnetic field at the location of the spin. The phase development of such moving spins corresponds then to a quadratic form in correspondence with:

$$\Delta\Phi = \gamma \int GS \, z(t)dt = \tfrac{1}{2} v_z t^2 \gamma GS,$$

wherein $\Delta\Phi$ is the phase shift, $\gamma$ is the gyromagnetic ratio, GS is the slice-selection gradient, z is the relative position of the region of the target object to be investigated in the NMR tomograph, t is the time, $v_z$ is the relative speed of the target object. This phase shift is relevant mainly for so-called multi-echo methods (known as fast spin echo (FSE), turbo spin echo (TSE) or RARE (rapid acquisition with relaxation enhancement)) since they disturb the coherence of refocusing over several echoes and therefore cause a drastic signal loss.

On the basis of the above-mentioned considerations, the following inventive measures are found to reproduce the consistency of data acquisition. The slice defined by the slice selection gradient and the frequency-selective excitation pulse is carried along with the moving target object during acquisition such that the pulse sequence acts in each case on identical volume regions of the moving target object (FIG. 4). This is advantageously effected in correspondence with the principle of slice selection in that the slice selection gradient for the individual excitation steps remains constant during application of the frequency-selective radio frequency pulses—like for recording a stationary object—while the selection frequency is changed in accordance with the motion of the object.

In correspondence with the Larmor relationship, the following applies:

$$\omega = \gamma B = \gamma B_0 + \gamma GS \, z = \gamma B_0 + \gamma GS \, v_z t = \omega_0 + \Delta\omega \quad [1]$$

wherein $\omega$ is the Larmor frequency, $\gamma$ is the gyromagnetic ratio and B is the magnetic flux density at the location of the spin. The latter is composed of the flux density $B_0$ of the magnet used and the contribution of the gradient GS at the location z. The respective location of the moved spin at a time t results thereby from the speed $v_z$.

A slice selection gradient GS of a strength of 20 mT/m and a displacement speed of 1 cm/s thereby produces a frequency shift of ~850 Hz over 100 ms.

For use in a multi-echo experiment, the frequency shift must occur within each echo train, i.e. subsequent refocusing pulses have different frequencies, wherein also the phase of the pulses must be selected in accordance with the CPMG conditions such that the phase coherence of the spins is maintained.

In the simplest case of using a pulse sequence which inherently excites signals from one single slice and which requires m recording steps for acquisition one complete data set for image reconstruction, the acquisition is performed such that the respectively selected excitation volume (target volume) is moved over these m steps between the position A1 and Am in FIG. 5 in correspondence with the displacement speed. The recording can subsequently be repeated, wherein, when the same slice positions A1 through Am are selected in the moved target object, a new slice of the target object which is correspondingly shifted parallel thereto due to its motion, is recorded. If the speed of motion is thereby selected such that Am is shifted relative to A1 by one slice distance ds, through the cyclic repetition complete recording of the object is obtained.

If multi-slice recording technology with ns individual slices is used, the measuring principle can be modified as follows: The slice position is carried along for k=np*m/ns recording steps, wherein np>=1<=ns. After acquisition of the recording steps A1 ... Ak, the slice position in the resting coordinate system of the analyzing magnet is switched further by one slice distance ds (FIG. 6). After m recording steps, complete data for image reconstruction from Ns=ns−(ns/np−1) slices is obtained, this cycle is subsequently repeated N times to obtain in total complete data for image reconstruction from (N−1)ns+NS=N−ns−(ns/np−1) slices. N is generally selected to be large such that the entire volume to be investigated (e.g. the entire body) is large compared to the recording volume covered by the ns slices. The fact that the data from (ns−NS) slices is incomplete for image reconstruction, can then be neglected.

Finally, it should be noted that the method can also be applied using three-dimensional position encoding. The recording steps A1 ... Am thereby correspond to the individual steps for recording a three-dimensional data set; the recording volume is always carried along with the moved object.

A further, very essential and new type of application of the measuring principle results from the finding that the method can be modified such that recording of images with different contrast can be carried out simultaneously through application of the described principles at spatially separate positions which is shown in FIG. 7. The signals are thereby acquired in the positions in the NMR tomograph marked by A1 ... Am and B1 ... Bm. Data acquisition with completely independent measuring sequences is thereby carried out within each of these two (or more) volumes under investigation (target volumes), therefore producing images with completely independent contrast. After passing the body once, (almost) simultaneously generated data sets with different contrast can be produced through continuous detection of the entire target object. To vary the contrast behavior of the signals independently of each other, the motion of the object must be sufficiently slow to ensure that spins which enter the volume B under investigation have sufficiently recovered from the previous signal excitation through the sequence acting on A with respect to the contrast-relevant parameters. The sequences acting on the partial target volumes can thereby be configured absolutely independently of each other. To obtain similar or identical volume coverages, it is in most cases advantageous (but not absolutely necessary) that the sequences attain similar or identical recording times for one recording cycle. The recording can thereby be carried out either through nesting of the individual steps (A1-B1-A2-B2 . . . ) or also—with sufficiently fast recording techniques—through segment-wise nesting up to nesting of the entire recording of a data set (A1-A2-. . . Am-B1-B2-. . . Bm).

Recording methods for such nested recording with different contrast, which are typically and frequently used in practice, are combinations of frequently used sequences such as T1-weighted recording, T2-weighted recording, STIR, FLAIR, diffusion-weighted recordings and many more.

The speed-dependent dephasing of the signals which occurs during the measurement due to the change of location of the target object and therefore of the spins to be investigated, can be eliminated using gradients which are compensated for with respect to a constant speed. This is analogous to the known principle of flux-compensated measuring methods (see e.g. Duerk et al, Magn. Reson. Imaging 8 (1990), 535). A necessary and sufficient condition for this is that, in addition to the integral under the gradient between excitation and reading, also the integral of the square of the gradient is set to zero. This is obtained in the most simple case through so-called bipolar motion-compensated gradients.

Figure 1:
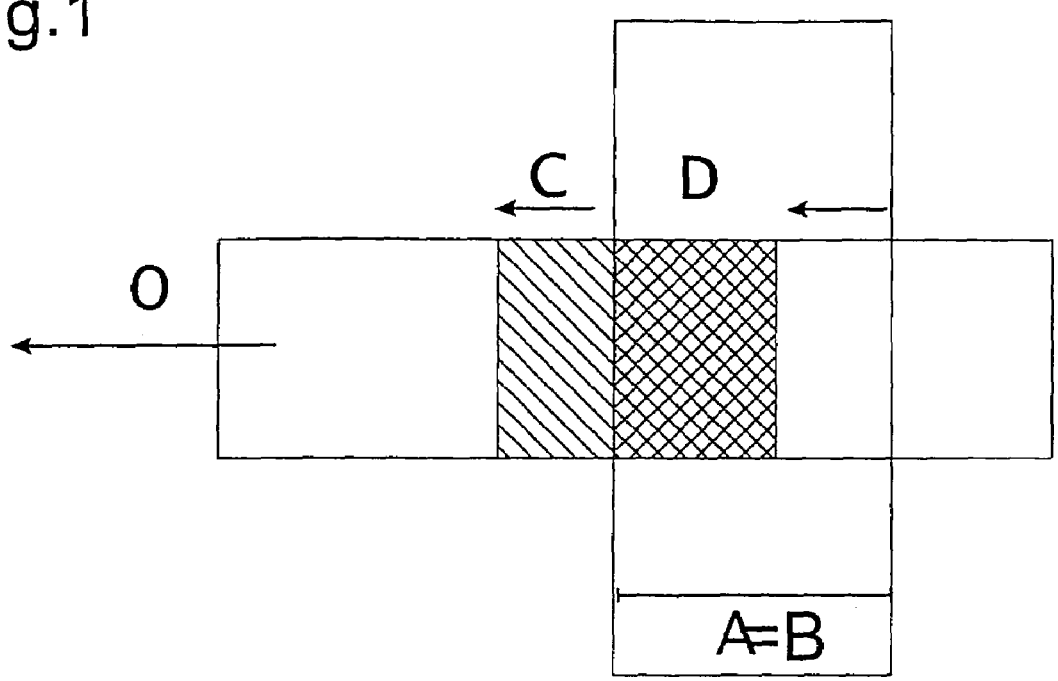
FIG. 1 shows the signal loss in a recording with fixed location of a partial volume A, wherein the object O moves in the direction of the arrow. If the partial volume A detected by the excitation pulse is identical with the partial volume B detected by the refocusing pulse, part of the originally excited spins (area C with inclined hatching) has moved out of the slice (i.e. the target volume) before refocusing and does therefore not contribute to signaling and the observed signal therefore originates only from the partial volume D (crosshatched).
Figure 2:
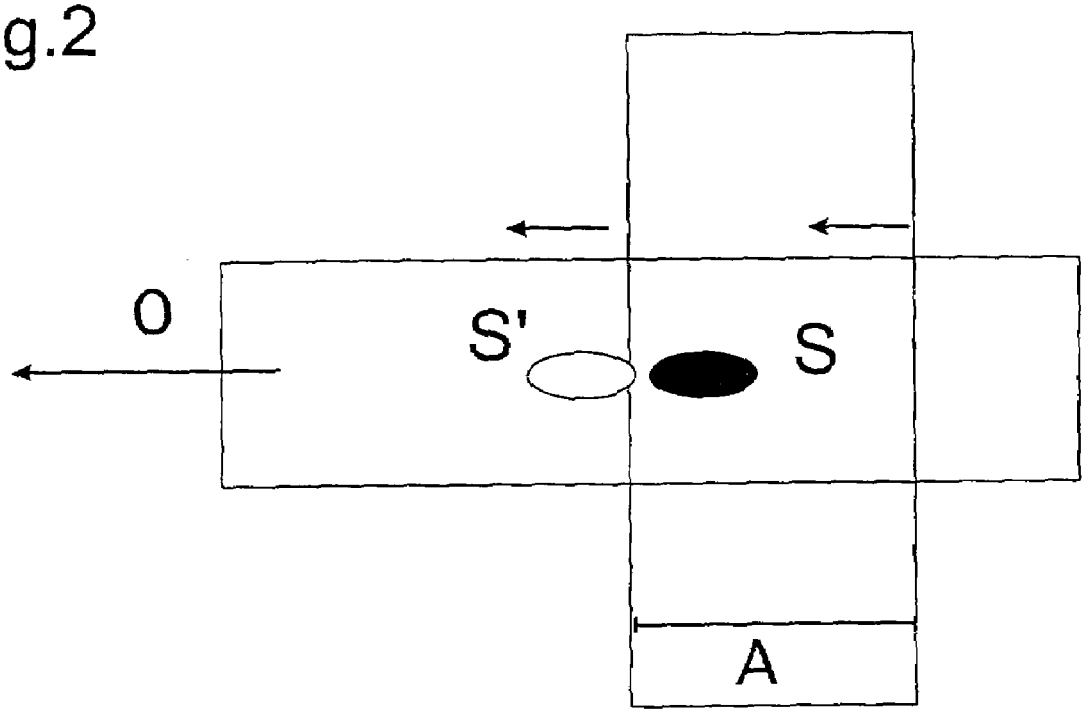
FIG. 2 shows the same for a structure S which moves out of the partial volume A detected by the slice-selective acquisition (i.e. the target volume) during acquisition of all individual steps used for image reconstruction and reaches the position S' outside of this volume A under investigation at the end of image acquisition. Since this structure provides no signal contribution during part of data acquisition, the data amount required for spatial encoding is incomplete which produces image artefacts.
Figure 3:
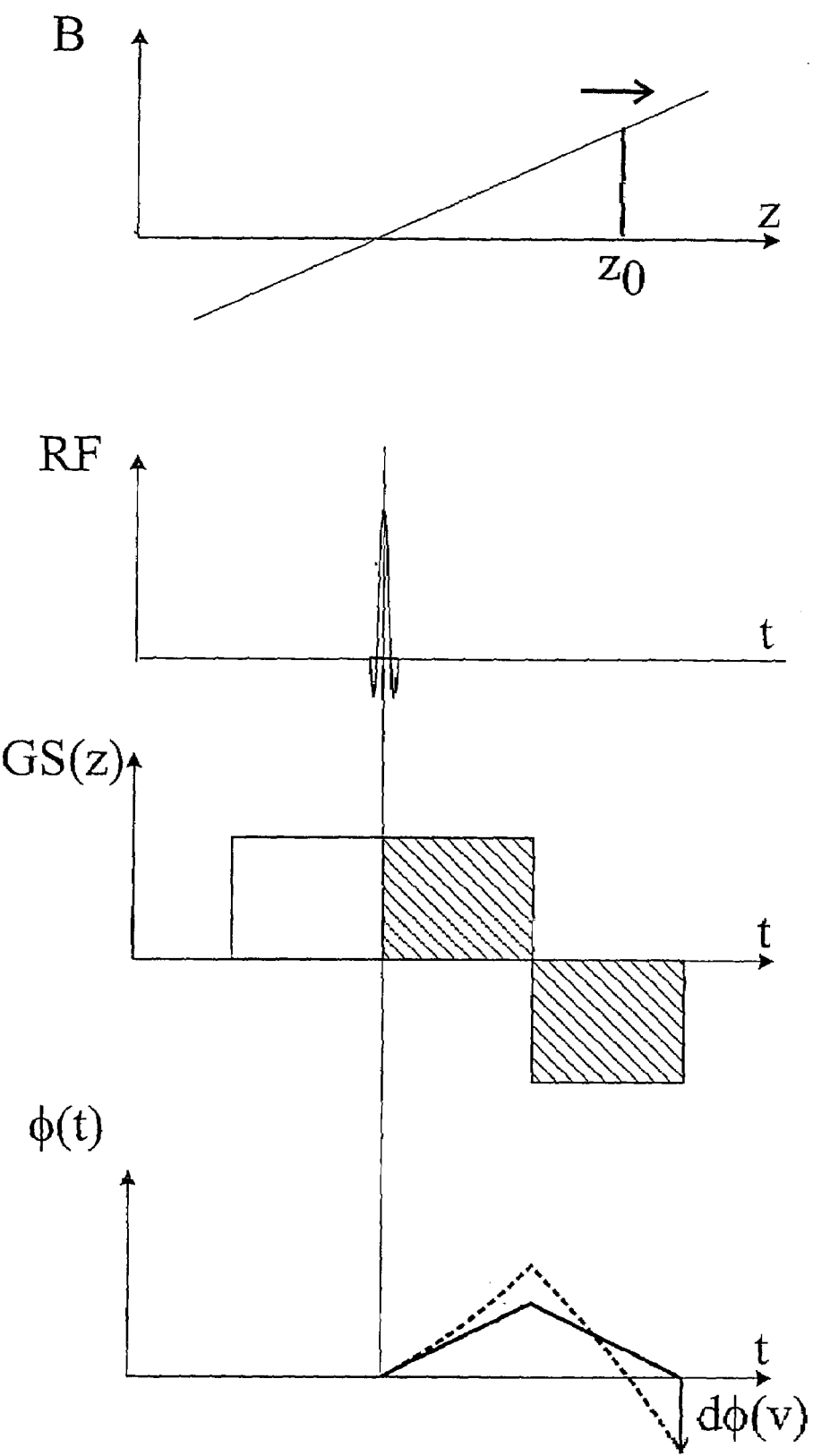
FIG. 3 shows the effect of the motion of the object on the phase $\Phi(t)$ of spins which move along a gradient GS during the acquisition. B is thereby the magnetic flux density which changes through application of a gradient linearly along the direction z of the gradient. RF shows the excitation pulse of an MR sequence, GS(z) shows the schematic diagram for the gradient used. A signal for stationary spins is produced when the integral over the gradient (hatched area) is zero. This condition is not met for moving spins; they experience dephasing $\Delta\Phi(v)$ which is proportional to the speed of motion.
Figure 4:
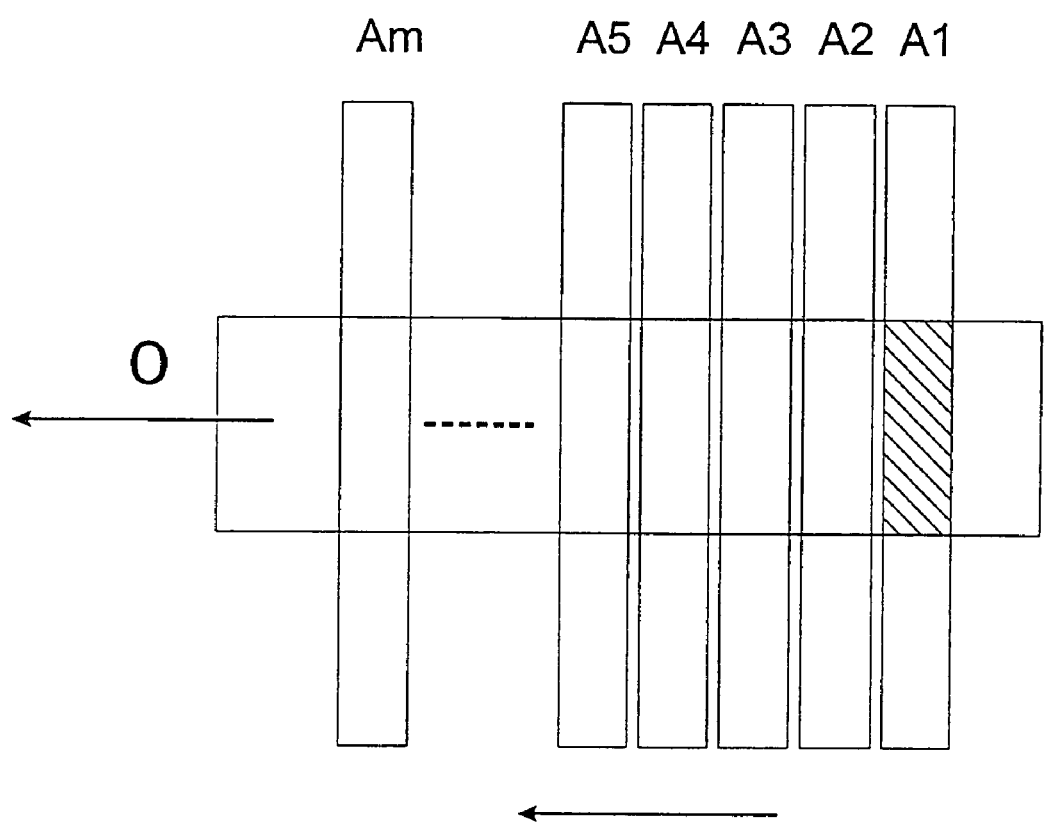
FIG. 4 shows the principle of the inventive method: the position of the respectively investigated slice (i.e. the target volume) is carried along with the moved target object in the NMR tomograph, such that the positions of the individual steps A1 . . . Am differ in space relative to the NMR tomograph, but detect respectively identical volumes of the moved target object. For spin echo methods, wherein several pulses are used for each individual step, the slice position is maintained also within each echo train. The respective slice positions are shown next to each other only for reasons of clarity. The slice continuation will generally be small compared to the slice thickness in dependence on the speed of motion.
Figure 5:
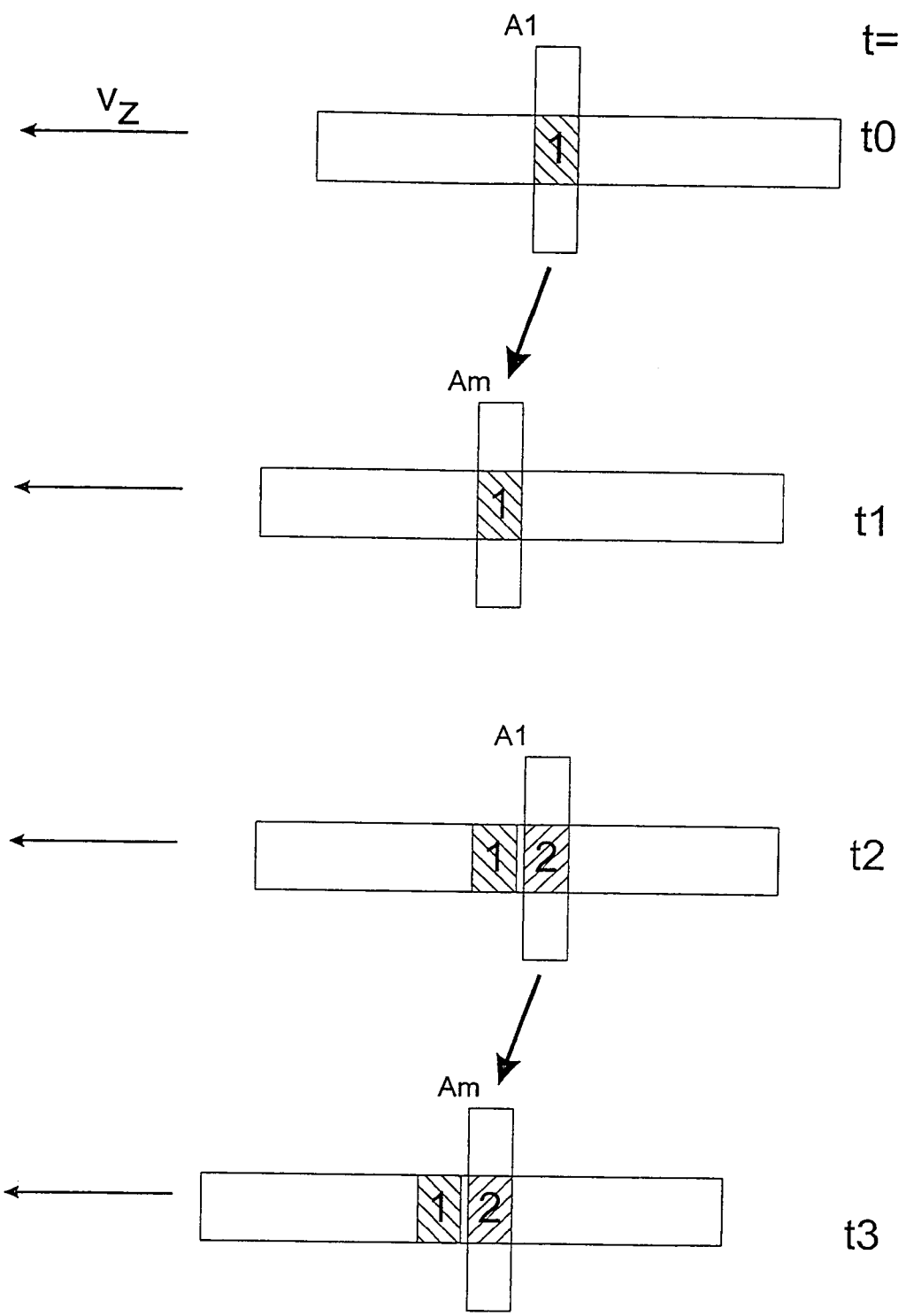
FIG. 5 shows the principle of a continuous acquisition of a target object moving at a speed $v_z$. During the time t0 . . . t1, the individual steps A1 . . . Am which are required for acquisition of a data set from the target volume 1 are recorded wherein the recording volume is moved together with the target object. The procedure is subsequently repeated with a second neighboring volume 2 within a time t2 . . . t3. With multiple repetition, a target object of any size can be successively and continuously investigated.
Figure 6:
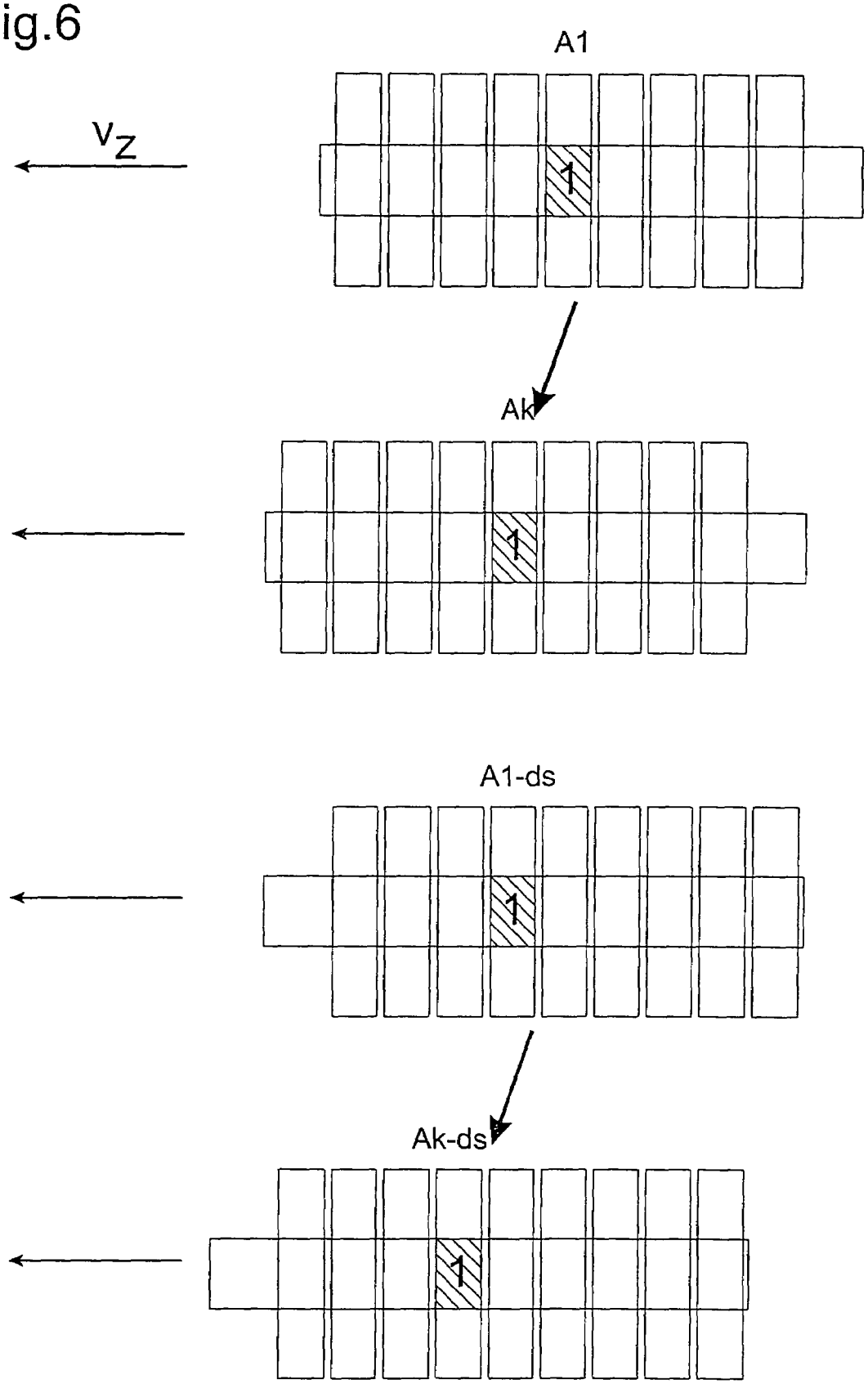
FIG. 6 shows the principle of continuous recording of a volume with application of a multi-slice acquisition method with ns individual slices: The recording slice is carried along with the moved object over k=m/ns individual steps, and the recording slice is subsequently displaced in the object by exactly one slice position ds.
Figure 7:
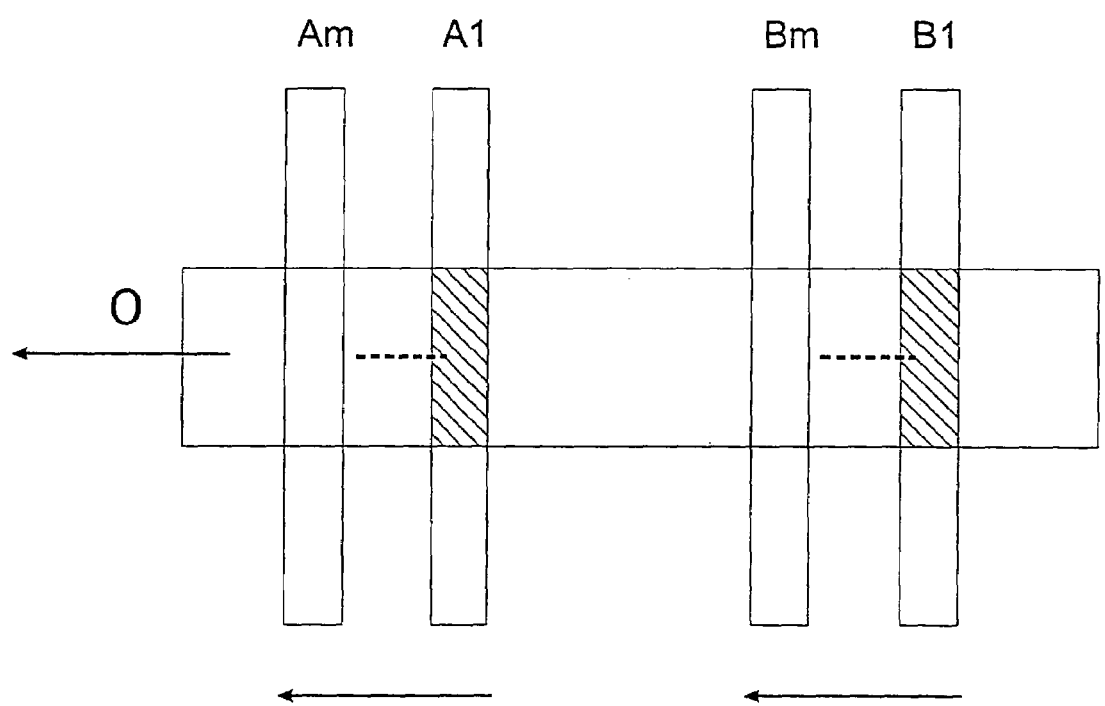
FIG. 7 shows the principle of continuous acquisition of data with sequences which effect different image contrasts: in the partial volume characterized by A1 . . . Am, a sequence with a certain contrast behavior is carried out in accordance with the above principles. In B1 . . . Bm, a second and different sequence is applied in a nested manner thereto, which produces a different contrast. The object is detected in two different contrasts with continuous acquisition through one single passage due to the motion of the object.

The invention presents an MRT method, wherein the object moves transversely to the direction of the selected volume during data acquisition, and wherein the signal losses caused through motion of the object and inconsistencies of recorded data are prevented in that the volume to be investigated is carried along with the moving object and all general conditions required for signal generation with respect to magnetic field gradient and the radio frequency pulses used, are adjusted to the motion of the object.

We claim:

1. Nuclear magnetic resonance (NMR) tomography method for investigating a target object, wherein radio frequency (RF) pulses are irradiated into a target volume and/or RF pulses from the target volume are detected, wherein the target volume is determined by the frequency of the RF pulses and/or through magnetic field gradients, and wherein the target object is moved relative to the NMR tomograph during NMR data acquisition, whereby the frequency of the RF pulses and/or the magnetic field gradients is/are changed during NMR data acquisition such that the target volume covered by the RF pulses is moved at the same speed and in the same direction of motion as the target object relative to the NMR tomograph during NMR data acquisition, whereby a multi-slice technology is applied for investigating ns slices, characterized in that during NMR data acquisition, two or more measuring sequences are applied in a nested manner, wherein the measuring sequences generally produce signals with different contrast, and wherein each measuring sequence acts on a different partial volume of the target object.

2. Method according to claim 1, characterized in that during NMR data acquisition, a slice-shaped target volume is investigated.

3. Method according to claim 2, characterized in that the target object moves parallel to the surface normal of the slice-shaped target volume.

4. Method according to claim 1, characterized in that the magnetic field gradients are kept constant during NMR data acquisition and only the frequency of the RF pulses is changed.

5. Method according to claim 4, characterized in that the following applies for the Larmor frequency $\omega$ of the RF pulses:

$$\omega(t) = \gamma * B_0 + \gamma * GS * v * t,$$

wherein $\gamma$ is the gyromagnetic ratio, $B_0$ is the static magnetic field, GS is the magnetic field gradient, v is the speed of the target object and t is the time.

6. Method according to claim 1, characterized in that the target object is uniformly moved relative to the NMR tomograph.

7. Method according to claim 1, characterized in that the movement of the magnetic field gradients is compensated for with respect to the speed of the target object, in the direction of motion of the target object, in particular, that the motion of the magnetic field gradients is bipolarly compensated for.

8. Method according to claim 1, characterized in that a multi-echo sequence in accordance with the principle of the RARE method is applied, wherein the pulse phase is additionally adjusted to the motion of the target object in accordance with the CPMG conditions.

9. Method of NMR tomography for investigating a target object, characterized in that several NMR data acquisitions are cyclically repeated through methods in accordance with claim 1.

10. Method of NMR tomography for investigating a target object, characterized in that several NMR data acquisitions are subsequently carried out through methods in accordance with claim 1, and wherein after each NMR data acquisition, the position of the target volume relative to the NMR tomograph is reset to an initial position.

11. Method according to claim 9, characterized in that during an NMR data acquisition, a slice-shaped target volume is investigated, and the target object moves further by exactly one slice thickness during one NMR data acquisition.

12. Method according to claim 9, wherein during NMR data acquisition, a slice-shaped target volumes are investigated, characterized in that in NMR data acquisition with m individual steps required for complete slice reconstruction after $k=np*m/ns$ individual steps, the position of the target volume is changed by one slice thickness to obtain complete data for image reconstruction after acquisition of $N*m$ individual steps for a total of $N*ns-(ns/np-1)$ slices, wherein $np \geq 1$, $N \geq 1$.

* * * * *

UNITED STATES PATENT AND TRADEMARK OFFICE
CERTIFICATE OF CORRECTION

PATENT NO. : 7,148,687 B2 Page 1 of 1
APPLICATION NO. : 11/289748
DATED : December 12, 2006
INVENTOR(S) : Jürgen Hennig and Oliver Speck It is certified that error appears in the above-identified patent and that said Letters Patent is hereby corrected as shown below:

On the title page insert item,
--(30) Foreign Application Priority Data: June 25, 2003 (DE) 103 28 423--

On the title page insert item,
--(62) Related U.S. Application Data: Division of Application No. 10/875,134 filed on June 23, 2004, now abandoned--

Signed and Sealed this

Seventh Day of December, 2010

David J. Kappos
*Director of the United States Patent and Trademark Office*